(12) United States Patent
Ushio et al.

(10) Patent No.: US 7,198,853 B2
(45) Date of Patent: Apr. 3, 2007

(54) ADHESIVE SHEET OF CROSS-LINKED SILICONE, METHOD OF MANUFACTURING THEREOF, AND DEVICE

(75) Inventors: Yoshito Ushio, Chiba Prefecture (JP); Katsuyuki Nakayama, Tokyo (JP); Toyohiko Fujisawa, Chiba Prefecture (JP)

(73) Assignee: Dow Corning Toray Silicone, Co., Ltd., Tokyo (JP)

( * ) Notice: Subject to any disclaimer, the term of this patent is extended or adjusted under 35 U.S.C. 154(b) by 261 days.

(21) Appl. No.: 10/489,789

(22) PCT Filed: Sep. 30, 2002

(86) PCT No.: PCT/JP02/10200

§ 371 (c)(1), (2), (4) Date: Mar. 29, 2004

(87) PCT Pub. No.: WO03/031528

PCT Pub. Date: Apr. 17, 2003

(65) Prior Publication Data

US 2004/0265599 A1    Dec. 30, 2004

(30) Foreign Application Priority Data

Oct. 3, 2001    (JP)    ............................. 2001-307150

(51) Int. Cl.
*B32B 9/04*    (2006.01)
(52) U.S. Cl. ...................................... 428/447
(58) Field of Classification Search ................. 428/447
See application file for complete search history.

(56) References Cited

U.S. PATENT DOCUMENTS

| 4,339,486 | A | * | 7/1982 | Shimamoto et al. | ........ 428/41.5 |
| 5,082,706 | A | * | 1/1992 | Tangney | ..................... 428/40.7 |
| 6,235,862 | B1 | | 5/2001 | Isshiki et al. | |
| 6,379,792 | B1 | * | 4/2002 | Isshiki et al. | ............ 428/355 R |
| 6,551,676 | B1 | * | 4/2003 | Yamakawa et al. | ......... 428/40.1 |
| 6,858,311 | B2 | * | 2/2005 | Sumita et al. | ............... 428/447 |
| 6,982,107 | B1 | * | 1/2006 | Hennen | ..................... 428/40.1 |

FOREIGN PATENT DOCUMENTS

| DE | 4319023 | | 9/1994 |
| EP | 1101810 | | 5/2001 |
| JP | 2000-96005 | * | 4/2000 |

* cited by examiner

*Primary Examiner*—Margaret G. Moore
(74) *Attorney, Agent, or Firm*—Howard & Howard Attorneys, P.C.

(57) ABSTRACT

A cross-linked silicone adhesive sheet has stability of peeling surfaces during peeling protective films away from both sides of the sheet. An adhesive sheet of a cross-linked silicone has protective films on both sides of the sheet. The protective films each have a thickness of 100 μm or less. A force of peeling of the protective films from the sheet is equal to or below 5.0 N/m. The difference between peeling forces of the films is equal to or exceeds 0.2 N/m. A method of manufacturing the adhesive sheet of a cross-linked silicone includes the steps of forming a film-like body by placing a cross-linkable silicone composition in a layer having a thickness of 100 μm or less between two protective films of different materials and then cross-linking the composition.

12 Claims, 1 Drawing Sheet

ADHESIVE SHEET OF CROSS-LINKED SILICONE, METHOD OF MANUFACTURING THEREOF, AND DEVICE

The present invention relates to cross-linked silicone adhesive sheets and to a method of manufacturing such sheets, more particularly, to cross-linked silicone adhesive sheets having surfaces of high peeling stability, as well as to an effective method of manufacturing sheets of the aforementioned type.

BACKGROUND

Japanese Laid-Open Patent Application Publication H11-12546, and its equivalent, U.S. Pat. No. 6,235,862, discloses a silicone adhesive sheet with protective films adhered to both sides of the sheet. The aforementioned sheet is intended for use as an adhesive means for attachment of semiconductor chips or chip supports. The protective films on both side of the aforementioned adhesive sheet are normally made from the same material.

However, if a cross-linked silicone adhesive sheet is made as a thin film with a thickness of 100 micrometers ($\mu m$) or less, conditions of peeling of the protective film from either side of the sheet become unstable.

It is an object of the present invention to provide an adhesive sheet of a cross-linked silicone characterized by stability of peeling of protective films from both sides of the sheet, as well as to provide an efficient method of manufacturing of the aforementioned adhesive sheet.

THE INVENTION

The invention relates to an adhesive sheet of a cross-linked silicone with a thickness of 100 $\mu m$ or less, and protective films adhered on both sides of said sheet, wherein a force of peeling of the protective films from the aforementioned sheet is equal to or below 5.0 Newtons per meter (N/m) and wherein the difference between peeling forces of the films is equal to or exceeds 0.2 N/m.

A method of the present invention for manufacturing an adhesive sheet of a cross-linked silicone comprises forming a film-like body by placing a cross-linkable silicone composition in a layer having a thickness of 100 $\mu m$ or less between two protective films and then cross-linking the composition. The method is characterized by making the protective films from different materials.

According to another aspect of the invention, a method of manufacturing an adhesive sheet of a cross-linked silicone by forming a film-like body by placing a cross-linkable silicone composition in a layer having a thickness of 100 $\mu m$ or less between two protective films and then cross-linking the composition, is characterized by the fact that the composition side of one of the protective films adhered to the composition is pretreated with an organopolysiloxane having at least two silicon-bonded hydrogen atoms in one molecule.

Figure 1:
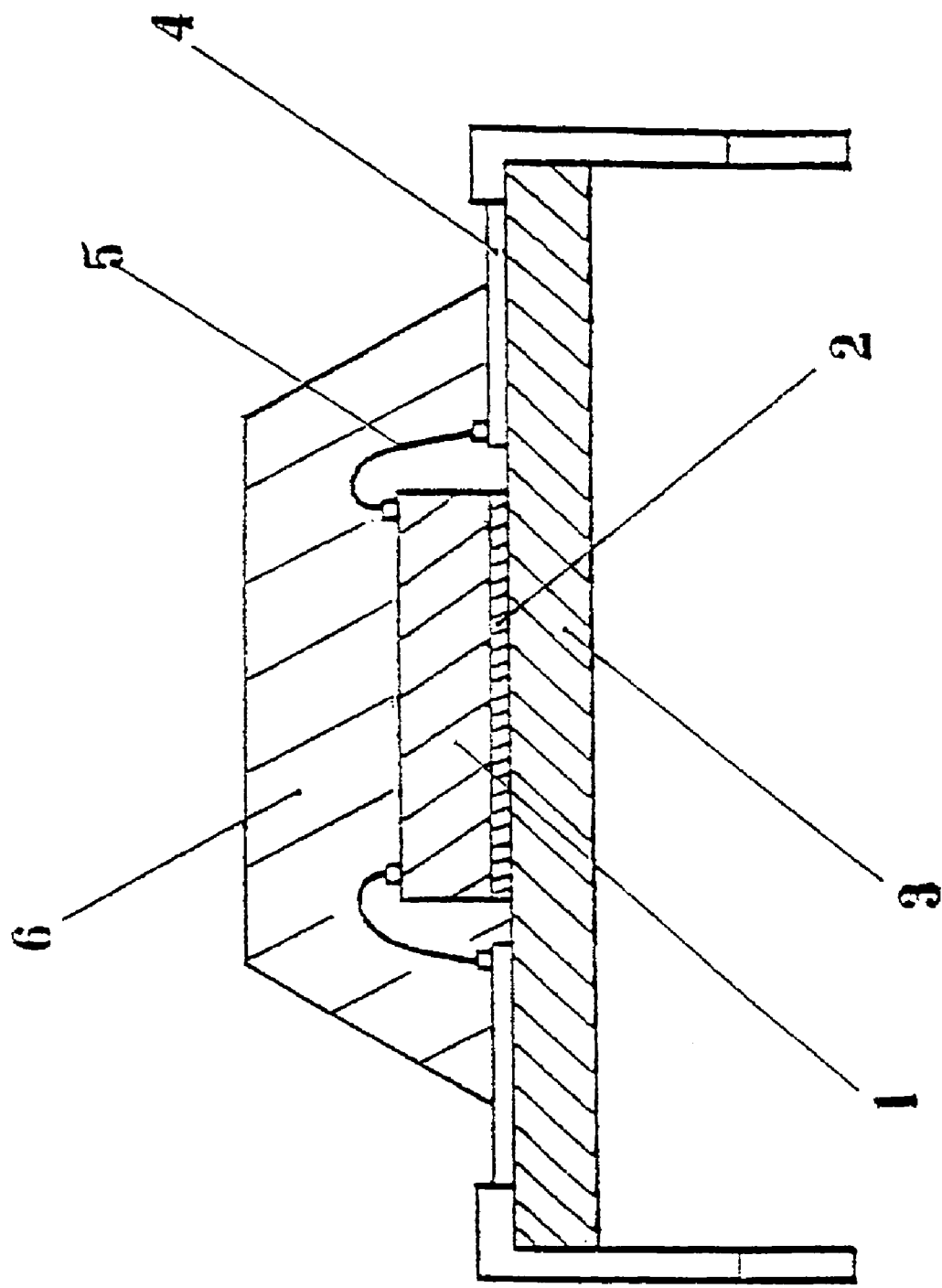
FIG. 1 is a cross-sectional view of hybrid integrated circuit (IC) as an example of a semiconductor device that can be produced with the use of the cross-linked silicone adhesive sheet of the invention.

REFERENCE NUMERALS USED IN THE DESCRIPTION 1 semiconductor chip
2 cross-linked silicone adhesive sheet
3 semiconductor chip support member
4 interconnects
5 bonding wires
6 sealing resin

DETAILED DESCRIPTION OF THE INVENTION

A cross-linked silicone adhesive sheet of the present invention will now be described in more detail. As mentioned above, an adhesive sheet of the present invention is made from a cross-linked silicone with a thickness of 100 $\mu m$ of less between protective films adhesively attached to both sides of the sheet. The aforementioned cross-linked silicone may comprise an elastomer in the form of a rubber or gel, but the rubber form is preferable. Furthermore, the cross-linked silicone adhesive sheet can be produced by cross-linking a cross-linkable silicone composition. Examples of the cross-linkable silicone composition suitable for the invention are those that can be cross-linked by a hydrosilylation reaction, a condensation reaction, a radical cross-linking reaction with the use of an organic peroxide, or with the use of ultraviolet rays, but the one that is cross-linked by a hydrosilylation reaction is preferred.

A silicone composition cross-linkable by a hydrosilylation reaction may comprise at least the following components: (A) an organopolysiloxane having at least two alkenyl groups in one molecule; (B) an organopolysiloxane having at least two silicon-bonded hydrogen atoms in one molecule; (C) adhesion accelerator; and (D) a metal hydrosilylation catalyst.

An organopolysiloxane of component (A) is a main component of the aforementioned composition and is characterized by having at least two alkenyl groups in one molecule. Examples of the molecular structures of component (A) include linear, linear with some branches, branched, and net-like structures. Examples of the alkenyl groups in component (A) include vinyl, allyl, butenyl, pentenyl, and hexenyl, with the vinyl group being preferred. The bonding positions of these alkenyl groups in component (A) may be at the molecular chain terminals and/or pendant. Examples of silicon-atom-bonded groups, other than alkenyl groups in component (A), include substituted and unsubstituted monovalent hydrocarbon groups such as the methyl, ethyl, propyl, butyl, pentyl, hexyl, heptyl, and other alkyl groups; aryl groups such as phenyl, tolyl, xylyl, and naphthyl; aralkyl groups such as benzyl and phenethyl; and halogenated alkyl groups such as chloromethyl, 3-chloropropyl, and 3,3,3-trifluoropropyl. The methyl groups and phenyl groups are preferred. To improve resistance of the cross-linked silicone sheet to cold and thus to improve reliability of a semiconductor device obtained by attaching a semiconductor chip or a chip-supporting member to the aforementioned sheet, it is recommended that for the phenyl group the content be at least 1 mol %, with a range of 1 to 60 mol % being preferred, and a range of 1 to 30 mol % being more preferred, with respect to the organic groups bonded to silicon atoms in component (A). There are no restrictions on the viscosity of component (A), but a range of 100 to 1,000,000 milli-Pascal seconds (mPa.s) at 25° C. is preferable.

An organopolysiloxane of component (B) is a cross-linking agent and is an organopolysiloxane having at least two hydrogen atoms bonded to silicon atoms per molecule. Examples of the molecular structure of component (B) include linear, linear with some branches, branched, and net-like. The bonding positions of the hydrogen atoms to silicone atom in component (B) may be at the molecular chain terminals and/or pendant. Examples of silicon atom-bonded groups other than hydrogen atoms in component (B) include substituted and unsubstituted monovalent hydrocarbon groups such as methyl, ethyl, propyl, butyl, pentyl, hexyl, heptyl, and other alkyl groups; aryl groups such as phenyl, tolyl, xylyl, and naphthyl; aralkyl groups such as benzyl and phenethyl, and halogenated alkyl groups such as chloromethyl, 3-chloropropyl, and 3,3,3-trifluoropropyl. The methyl group and phenyl group are particularly favorable. There are no restrictions on the viscosity of component (B), but a range of 1 to 100,000 mPa•s at 25° C. is preferable.

Although there are no special restrictions on the amount of component (B) required for use in the composition, it is recommended that this component be contained in an amount sufficient for cross-linking of the above composition. More specifically, it should be used in an amount from 0.5 to 10 moles, preferably between 1 and 3 moles of silicon-bonded hydrogen atoms per mole of alkenyl groups in component (A). This is because cross-linking will tend to be inadequate if component (B) is used in an amount less than the recommended range, but if the amount of component (B) used exceeds the recommended upper limit, the heat resistance of the cross-linked adhesive sheet obtained will tend to be lower.

Component (C) is an agent that increases the adhesiveness of the composition and is used to impart particularly good adhesiveness to the cross-linked silicone product of the above composition. An organic silicon compound having at least one silicon-bonded alkoxy group per molecule is preferable for use as compound (C). The aforementioned alkoxy group can be represented by a methoxy, ethoxy, propoxy, butoxy, and methoxyethoxy group, the most preferable of which is a methoxy group. The following are examples of groups other than the alkoxy groups bonded to silicon atoms in the aforementioned organic silicon compounds: hydrogen atoms; substituted and unsubstituted monovalent hydrocarbon groups such as methyl, ethyl, propyl, butyl, pentyl, hexyl, heptyl, and other alkyl groups; vinyl, allyl, butenyl, pentenyl, hexenyl, and other alkenyl groups; phenyl, tolyl, xylyl, naphthyl, and other aryl groups; benzyl, phenethyl, and other aralkyl groups; chloromethyl, 3-chloropropyl, 3,3,3-trifluoropropyl, and other halogenated alkyl groups; 3-glycidoxypropyl, 4-glycidoxybutyl groups, and other glycidoxyalkyl groups; 2-(3,4-epoxycyclohexyl) ethyl, 3-(3,4-epoxycyclohexyl)propyl, and other epoxycyclohexylalkyl groups; monovalent organic groups that contain epoxy groups such as 4-oxyranylbutyl, 8-oxyranyloctyl, and other oxyranylalkyl groups; monovalent organic groups that contain acryl groups such as 3-methacryloxypropyl groups, or the like. It is recommended that the aforementioned organic silicon compounds contain in one molecule at least one alkenyl group or a silicon-bonded hydrogen atom. Furthermore, from the point of view of improved adhesion of substrates of various materials to the adhesive silicone sheets produced by cross-linking the aforementioned composition, it is recommended that the aforementioned organic silicone compound contain in one molecule a monovalent organic group with at least one epoxy group. Such organic silicon compounds can be represented by silanes, siloxanes, and silatranes. The aforementioned siloxane compounds may have a linear, linear with some branches, branched, cyclic, and net-like structure. The linear, branched, and net-like structures are preferable. The following are specific examples of the aforementioned organic silicon compounds: 3-glycidoxypropyl trimethoxysilane, 2-(3,4-epoxycyclohexyl)ethyl trimethoxysilane, 3-methacryloxypropyl trimethoxysilane, or a similar silane compound; a siloxane compound having in one molecule at least one of the following: a silicon-bonded alkenyl group, a silicon-bonded hydrogen atom, or a silicon-bonded alkoxy group; a mixture of a silane or a siloxane compound having at least one silicon-bonded alkoxy group with a siloxane compound having in one molecule at least one of the following: a silicon-bonded hydroxy group or a silicon-bonded alkenyl group; a siloxane compound expressed by the following general formula:

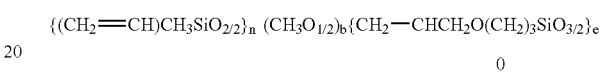

where a, b, and c are positive numbers;
a siloxane compound expressed by the following general formula:

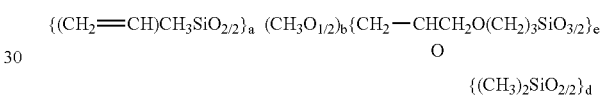

a silatrane compound expressed by the following general formula:

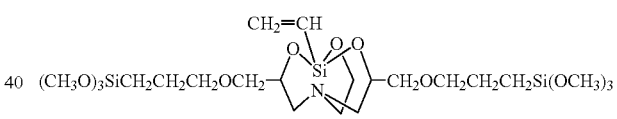

or a silatrane compound expressed by the following general formula:

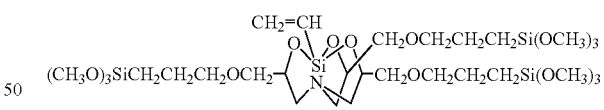

Although there are no special restrictions with regard to the amount of component (C) suitable for use in the composition of the invention, it should be sufficient for providing good adhesion to the cross-linked silicone adhesive sheet produced by cross-linking the aforementioned composition. More specifically, it is recommended to use component (C) in an amount of 0.01 to 20, preferably 0.1 to 10 parts by weight for each 100 parts by weight of component (A). This is because, if the aforementioned amount is below the lower recommended limit, the adhesive sheet will have a tendency to decrease in adhesivity, and if the aforementioned amount exceeds the upper recommended limit, then along with the decrease in adhesivity, the cross-linked silicone adhesive sheet will have a tendency of variation in mechanical properties.

Component (D) is a metal catalyst that accelerates the hydrosilylation reaction-based cure of the composition. Component (D) can be, e.g., platinum catalysts, rhodium catalysts, and palladium catalysts. To provide better cross-linking reaction rates, it is recommended to use platinum catalysts. The platinum catalysts can be exemplified by platinum micro powder, platinum black, platinum supported on silica micro powder, platinum supported on active carbon, chloroplatinic acid, alcohol solutions of chloroplatinic acid, olefin complexes of platinum, and alkenylsiloxane complexes of platinum.

Although there are no special restrictions with regard to the quantity in which component (D) should be used, it is recommended to add it in sufficient quantity to accelerate the cure of the composition under consideration. When a metal catalyst is used as component (D), the catalyst will be added so as to provide the subject composition with preferably from 0.01 to 1,000 weight-ppm metal based on the weight of the composition and particularly preferably from 0.1 to 500 weight-ppm metal based on the weight of the composition. The rate of cross-linking declines substantially when the addition of component (D) falls below the given range. Additions above the given range have little effect on the cure rate, but cause such problems as, for example, discoloration.

For adjusting the rate of cross-linking, the composition of the invention can be combined with a hydrosilylation reaction inhibitor, such as 3-methyl-1-butyn-3-ol, 3,5-dimethyl-1-hexyn-3-ol, and phenylbutynol; ene-yne compounds such as 3-methyl-3-penten-1-yne and 3,5-dimethyl-3-hexen-1-yne; and also 1,3,5,7-tetramethyl-1,3,5,7-tetravinylcyclotetrasiloxane, 1,3,5,7-tetramethyl-1,3,5,7-tetrahexenylcyclotetrasiloxane, and benzotriazole. Although there are no special restrictions for the amounts in which the above inhibitors can be used, it is recommended to add these inhibitors in the range from 0.00001 to 5 parts by weight for each 100 parts by weight of component (A).

Other components that may be added on an optional basis to the curable silicone composition under consideration are exemplified by inorganic fillers such as precipitated silica, wet-process silica, fumed silica, calcined silica, titanium oxide, alumina, glass, quartz, aluminosilicates, iron oxide, zinc oxide, calcium carbonate, carbon black, silicon carbide, silicon nitride, boron nitride, and so forth; these inorganic fillers after treatment with an organosilicon compound such as an organohalosilane, organoalkoxysilane, or organosilazane; organic resin micro powders, such as those of silicone resins, epoxy resins, and fluororesins; particulate fillers of electrically conductive metals such as silver and copper; and also dyes, pigments, flame retardants, and solvents.

The cross-linked silicone adhesive sheet of the present invention has protective films adhered to both sides of the sheet. Such protective films protect adhesive surfaces of the sheet from contamination by dirt and must be peeled away from the adhesive sheet prior to use of the adhesive sheet. It is required that a force of peeling of the protective films from both sides of the cross-linked silicone adhesive sheet of the present invention be equal to or below 5.0 N/m. If a force required for peeling a protective film from the cross-linked silicone adhesive sheet exceeds 5.0 N/m, there is a chance that the protective film will be broken. Another requirement is that the difference between peeling forces on both sides of the adhesive sheet be 0.2 N/m or greater, preferably 0.5 N/m or greater. If the aforementioned difference is below the indicated limit, it would be difficult to provide stability of peeling over the entire peeling surface.

The protective films can be made from a polyethersulfone resin (PES), acetyl cellulose resin, polyimide resin, polyester resin, polyether resin, epoxy resin, phenol resin, polyamide resin, or a similar organic resin; be made by coating the aforementioned resins on a surface of films made from other organic resins, or be made by laminating the aforementioned resins and the other organic resins. The aforementioned acetyl cellulose resin can be exemplified by diacetyl cellulose resin and triacetyl cellulose resin (TAC). The difference in peeling forces on both sides of the sheet can be increased by making protective films adhered to both sides of the sheet from different materials. A combination of the protective films can be, e.g., a combination of PES film and acetyl cellulose resin film, a combination of PES film and the other organic resins film with acetyl cellulose resin layer on the surface, a combination of the other organic resins film with PES layer on the surface and acetyl cellulose resin film, and a combination of the other organic resins film with PES layer on the surface and the other organic resins film with acetyl cellulose resin layer on the surface. It is recommended to use a combination of PES film and acetyl cellulose resin film, a combination of PES film and polyethyleneterephthalate (PET) film with acetyl cellulose resin layer on the surface, or a combination of PET film with PES layer on the surface and PET film with acetyl cellulose resin layer on the surface. On the other hand, the difference in peeling forces on both sides of the sheet also can be increased by pre-treating a surface of either one of the protective films, to which said composition is applied, with an organopolysiloxane having at least two silicon-bonded hydrogen atoms in one molecule. The organopolysiloxane having at least two silicon-bonded hydrogen atoms in one molecule and used for pretreatment of the protective film may be the same as the organopolysiloxane of component (B). Where one protective film has a surface pretreated with the organopolysiloxane having at least two silicon-bonded hydrogen atoms per molecule, the protective films may be made from the same or different materials. Where neither protective film has a surface pretreated with an organopolysiloxane having at least two silicon-bonded hydrogen atoms per molecule, the protective films are made from different materials.

A method of manufacturing a cross-linked silicone adhesive sheet of the invention comprises sandwiching a cross-linkable silicone composition between two protective films, so that the thickness of the layer of the composition does not exceed 100 μm, and then forming a cross-linked silicone adhesive sheet by cross-linking the composition, the protective films being made from different materials.

Examples of cross-linked silicone compositions suitable for use in the method of the invention are the following: a silicone composition cross-linkable via a hydrosilylation reaction, a silicone composition cross-linkable via a condensation reaction, a silicone composition cross-linkable via a radical reaction with the use of an organic peroxide, and a silicone composition cross-linkable under the effect of high-energy radiation. The most preferable is a silicone composition cross-linkable via a hydrosilylation reaction. It is recommended that the aforementioned silicone composition cross-linkable in a hydrosilylation reaction comprise at least the following components: (A) an organopolysiloxane having at least two alkenyl groups in one molecule; (B) an organopolysiloxane having at least two silicon-bonded hydrogen atoms per molecule; (C) adhesion accelerator; and (D) a metal hydrosilylation catalyst. The silicone composition cross-linkable via a hydrosilylation reaction and used in the present invention is the one described earlier.

The protective films suitable for use in the method of the invention can be made from a polyethersulfone resin (PES), acetyl cellulose resin, polyimide resin, polyester resin, polyether resin, epoxy resin, phenol resin, polyamide resin, or a similar organic resin; be made by coating the aforementioned resins on a surface of films made from other organic resins, or be made by laminating the aforementioned resins and the other organic resins. The aforementioned acetyl cellulose resin can be exemplified by diacetyl cellulose resin and triacetyl cellulose resin (TAC). In the method of the invention, the cross-linkable silicone composition is sandwiched between two protective films which may be made of different materials. Although there are not special restrictions with regard to a combination of the protective films for use on opposite sides of the sheet, the combination of protective films can be, e.g., a combination of PES film and acetyl cellulose resin film, a combination of PES film and the other organic resins film with acetyl cellulose resin layer on the surface, a combination of the other organic resins film with PES layer on the surface and acetyl cellulose resin film, and a combination of the other organic resins film with PES layer on the surface and the other organic resins film with acetyl cellulose resin layer on the surface. It is recommended to use a combination of PES film and acetyl cellulose resin film, a combination of PES film and polyethyleneterephthalate (PET) film with acetyl cellulose resin layer on the surface, or a combination of PET film with PES layer on the surface and PET film with acetyl cellulose resin layer on the surface.

In the method of the invention, a film-like product is formed by sandwiching a cross-linkable silicone composition between two protective films, and then a cross-linkable silicone adhesive sheet is formed by cross-linking the aforementioned composition. Cross-linking can be carried out by retention at room temperature, at 200° C. or less, preferably 120° C. or less, or by irradiating with an electron beam.

According to another method of the invention, a film-like product is formed by sandwiching a cross-linkable silicone composition between two protective films so that the thickness of the composition layer becomes 100 μm or less, and a cross-linked silicone adhesive sheet is formed by cross-linking the aforementioned composition. In this case the surface of a protective film adhered to one side of the composition is pretreated with an organopolysiloxane having at least two silicon-bonded hydrogen atoms per molecule.

The cross-linkable silicone compositions suitable for the method of the invention are those that can be cross-linked by a hydrosilylation reaction, a condensation reaction, a radical cross-linking reaction with the use of an organic peroxide, or with the use of ultraviolet rays, but the one that is cross-linked by a hydrosilylation reaction is preferred. It is preferable that the silicone composition cross-linkable by a hydrosilylation reaction comprise at least the following components: (A) an organopolysiloxane having at least two alkenyl groups in one molecule; (B) an organopolysiloxane having at least two silicon-bonded hydrogen atoms in one molecule; (C) adhesion accelerator; and (D) a metal hydrosilylation catalyst. For the reasons described earlier, the use of the silicone composition cross-linkable by a hydrosilylation reaction is preferable.

The protective films suitable for the method of the invention may be represented by a polyethersulfone resin (PES), acetyl cellulose resin, polyimide resin, polyester resin, polyether resin, epoxy resin, phenol resin, polyamide resin, or a similar organic resin; be made by coating the aforementioned resins on a surface of films made from other organic resins, or be made by laminating the aforementioned resins and the other organic resins. The aforementioned acetyl cellulose resin can be exemplified by diacetyl cellulose resin and triacetyl cellulose resin (TAC). In the method of the invention, the protective films, between which the cross-linkable silicone composition is sandwiched, can be made from different as well as from the same materials. It is required that the composition side of either of the protective films adhered on the composition be pretreated with an organopolysiloxane having at least two silicon-bonded hydrogen atoms in one molecule. Such organopolysiloxane may be the same as aforementioned component (B). The aforementioned organopolysiloxane having at least two silicon-bonded hydrogen atoms in one molecule can be applied onto the surface of the protective film by simple spreading with subsequent heat treatment.

Thus the method of the invention is carried out by placing a cross-linkable silicone composition between two films to form a film-like product and then cross-linking the composition to produce a cross-linked silicone adhesive sheet. Cross-linking of the cross-linkable silicone composition can be performed by retaining the composition at room temperature, at 200° C. or less, preferably 120° C. or less, or by irradiating with an electron beam.

The cross-linked silicone adhesive sheet of the invention is used for attaching a semiconductor chip to a chip support. It is recommended that the cross-linked silicone adhesive sheet contain a minute quantity of uranium or thorium, e.g., with the total amount of no more than 1 ppb. The cross-linked silicone adhesive sheet may contain a small amount of ions of sodium, potassium, or of a similar alkali metal, in particular, in an amount of no more than 1 ppm.

A method of manufacturing a semiconductor device with the use of the aforementioned cross-linked silicone adhesive sheet will now be described in more detail. Applicable semiconductor devices can be exemplified by diodes, transistors, thyristors, monolithic integrated circuits, hybrid integrated circuits, large-scale integrated circuits, and very large-scale integrated circuits. An examples of semiconductor device according to the present invention is shown in FIG. 1, which is a cross section of a hybrid integrated circuit. In the semiconductor device shown in FIG. 1, a semiconductor chip 1 is bonded to a semiconductor chip support 3 using a cross-linked silicone adhesive sheet 2. The semiconductor chip 1 and interconnects 4, which are connected to the outer leads, are electrically connected to the semiconductor chip 1 by bonding wires 5. The semiconductor chip 1 may comprise a memory unit of a diode, transistor, thyristor, monolithic integrated circuit, or of a hybrid integrated circuit, or a semiconductor chip in a hybrid integrated circuit. The semiconductor chip support 3 can be made from a ceramic, glass, epoxy resin, polyimide resin, phenolic resin, bakelite resin, melamine resin, glass fiber-reinforced epoxy resin, and glass fiber reinforced BT resin. The interconnects 4 can be made of gold, copper, aluminum, silver-palladium, indium-tin oxide (ITO), and so forth. The bonding wires 5 can be made of gold, copper, or aluminum. The semiconductor element 1 is also sealed with a sealant resin 6. The resin making up the sealant resin 6 can be exemplified by epoxy resin, phenolic resin, and polyphenylene sulfide resin. In addition to the semiconductor chip 1, other electronic components, e.g., resistors, capacitors, coils, etc., can be mounted on the circuit substrate 3.

The method for attaching the semiconductor chip to the aforementioned chip support via a cross-linked silicone adhesive sheet can be carried out by first affixing the adhesive silicone sheet to the semiconductor chip 1 and then affixing the semiconductor chip 1 to the semiconductor chip support 3 via the aforementioned sheet, or by first affixing the adhesive sheet made of silicone to the semiconductor chip support 3 and then affixing the semiconductor chip 1 to the semiconductor chip support 3 via the adhesive sheet. Although there are no special restrictions with regard to the temperature at which the cross-linked silicone adhesive sheet can be adhered to the semiconductor chip and the chip support, it is recommended to do this at a temperature between 50° C. and 200° C., preferably between 100° C. and 150° C. Normally, in connecting the cross-linked silicone adhesive sheet 2 to the semiconductor chip 1 and the chip support 3, heating is carried out in two steps. More specifically, after preliminary attachment with heating and application of pressure for 1 to 2 seconds, a post-curing is carried out in an oven at 150° C. to 170° C. for final connection.

After curing, the semiconductor chip 1 and interconnects 4 are electrically connected by bonding wires 5. Normally, this is done by ultrasonic welding. If necessary, the semiconductor chip 1 then can be sealed with a resin sealant 6. Since a semiconductor chip can be attached to the chip support with the use of the silicone adhesive sheet at a relatively low temperature, there will be no danger of damaging the semiconductor chip under the effect of heat. This, in turn, makes it possible to improve reliability of the semiconductor device.

EXAMPLES

The cross-linked silicone adhesive sheet of the invention and method of manufacturing of this adhesive sheet will now be described in detail with reference to practical examples. The viscosity values reported in the examples were measured at 25° C. The following methods were used to evaluate reliability and to measure the force required for peeling a protective film from the cross-linked silicone adhesive sheet.

Force For Peeling a Protective Film from a Cross-linked Silicone Adhesive Sheet Test specimens were produced by cutting a cross-linked silicone adhesive sheet with protective films adhered to both sides of the sheet into 1 centimeter (cm)×15 cm strips. A protective film adhered to one side of the test specimen (hereafter referred to as side A) was pulled away from the specimen surface at an angle of 180° at a rate of 100 millimeters per minute (mm/min). An average value of stress developed during this action was measured. This average value was assumed as a force of peeling of the protective film from the cross-linked silicone adhesive sheet. The peeling force of the protective film from the other side of the specimen (hereafter referred to as side B) was determined in the same manner.

Manufacturing of a Semiconductor Device and Evaluation of Initial Adhesiveness The cross-linked silicone adhesive sheet was used for manufacturing a semiconductor device shown in FIG. 1. More specifically, a semiconductor chip (1 cm×1 cm) and a semiconductor chip support (3 cm×3 cm) made of polyimide were interconnected via the cross-linked silicone adhesive sheet (1 cm×1 cm), and then under a pressure developed by application of a 1 megaPascal (MPa) force, the unit was heated for 2 seconds at 190° C. The pressure was released, and the obtained unit was placed into a 170° C. oven for 1 hour. The unit was then removed from the oven, and the polyimide-made semiconductor chip support and the cross-linked silicone adhesive sheet were visually observed. After the test piece was formed from well adhered components, the bonding pads located on the top of the semiconductor chip 1 and the interconnects 4 were then electrically connected by wires 5 fixed with ultrasonic welding.

Evaluation of Rejection Rate of Semiconductor Devices

The semiconductor device was inserted into a socket and was tested by passing electric current between the device terminals. In the current test, the percentage of semiconductor devices that failed to pass the current was considered as a rejection rate.

Practical Example 1

A Ross mixer was filled with the following components: 31 parts by weight of a 2,200 milli-Pascal seconds (mPa•s) viscosity dimethylpolysiloxane having both molecular terminals capped with dimethylvinylsiloxy groups (with 0.23 wt. % content of vinyl groups) and containing 0.01 wt. % of a low-molecular-weight siloxane with vapor pressure exceeding 10 millimeters of mercury (mmHg) at 200° C.; 56 parts by weight of a 7,000 mPa•s viscosity organopolysiloxane mixture composed of 65 wt % of a 2,000 mPa.s viscosity dimethylpolysiloxane having both molecular terminals capped with dimethylvinylsiloxy groups (with 0.23 wt. % content of vinyl groups) and 35 wt. % of an organopolysiloxane resin composed of $(CH_2\!=\!CH)(CH_3)_2SiO_{1/2}$ units, $(CH_3)_3SiO_{1/2}$ units, and $SiO_{4/2}$ units (with 2.5 wt. % content of vinyl groups); and 13 parts by weight of fumed silica having BET specific surface area of 200 m²/g. After mixing 1 hour at room temperature, the mixture was mixed for another 2 hours at 170° C. under a reduced pressure. As a result, after cooling the mixture to room temperature, a paste-like semitransparent silicone rubber base was obtained.

100 parts by weight of the obtained base were uniformly mixed in vacuum with 6 parts by weight of a 5 mPa•s viscosity dimethylsiloxane-methylhydrogensiloxane copolymer having both molecular terminals capped with trimethylsiloxy groups (with 0.73 wt. % content of silicon-bonded hydrogen atoms) and expressed by the following average molecular formula:

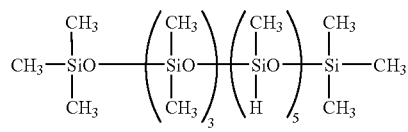

so that 1.8 moles of silicon-bonded hydrogen atoms of this component were used for 1 mole of vinyl groups in component (A), 1 parts by weight of an organopolysiloxane (with 16 wt. % content of vinyl groups) expressed by the following average-unit formula:

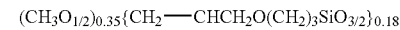

0.5 parts by weight of a silatrane derivative expressed by the following formula:

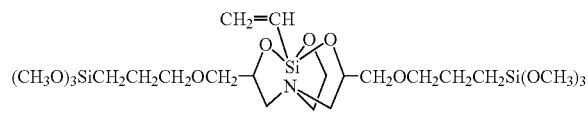

and a complex of platinum with 1,3-divinyltetramethyidisiloxane (with concentration of platinum metal in the complex equal to 5 ppm). As a result, a 70,000 mPa•s viscosity silicone-rubber composition cross-linkable via a hydrosilylation reaction was prepared. The total content of uranium and thorium in the obtained composition did not exceed 0.1 ppb, and the total content of ions of sodium, potassium, or other alkali metal did not exceed 0.1 ppm.

The obtained silicone composition was sandwiched between a 50 μm thick surface-nontreated PES film and a 50 μm thick PES film having the surface pretreated with Treatment Agent No. 1, a 30 mPa•s viscosity methylhydrogenpolysiloxane having both molecular terminals capped with trimethylsiloxy groups (1.6 wt. % content of silicon-bonded hydrogen atoms). The obtained sandwich was rolled between a two-roll device with an adjustable clearance between the stainless-steel rolls so that the thickness of the silicone composition was 30 μm. A silicone-rubber adhesive sheet with PES films on both surfaces was produced after heating the rolled sandwich for 30 minutes in an 80° C. oven with circulation of hot air.

First, the PES film having the surface coated with Treatment Agent No. 1 was stably peeled away from the obtained silicone rubber adhesive sheet. Measurement of forces required for peeling off both protective films showed that the PES film having the surface treated with Treatment Agent No. 1 could be peeled off with the peeling force of 1.9 N/m, while the non-treated PES film could be peeled off with the peeling force of 2.3 N/m.

A semiconductor device was produced by interconnecting a semiconductor chip and a chip support member by means of the aforementioned silicone rubber adhesive sheet. Adhesiveness of the silicone rubber adhesive sheet to the semiconductor chip and to the chip support member was evaluated, and the rejection rate of semiconductor devices was determined. The results are shown in Table 1.

Practical Example 2

The silicone rubber composition cross-linkable via a hydrosilylation reaction and produced in Practical Example 1 was sandwiched between a 50 μm thick surface-nontreated PES film and a 50 μm thick PES film having the surface pretreated with Treatment Agent No. 2, a 10 mPa•s viscosity dimethylpolysiloxane having both molecular terminals capped with dimethyihydrogensiloxy groups (0.16 wt. % content of silicon-bonded hydrogen atoms). The obtained sandwich was rolled between a two-roll device with an adjustable clearance between the stainless-steel rolls so that the thickness of the silicone composition was 30 μm. A silicone-rubber adhesive sheet with PES films on both surfaces was produced after heating the rolled sandwich for 30 min. in an 80° C. oven with circulation of hot air.

First, the PES film having the surface not treated with Treatment Agent No. 2 was stably peeled away from the obtained silicone rubber adhesive sheet. Measurement of forces required for peeling off both protective films showed that the PES film having the surface treated with Treatment Agent No. 2 could be peeled off with the peeling force of 2.8 N/m, while the non-treated PES film could be peeled off with the peeling force of 2.3 N/m.

A semiconductor device was produced by interconnecting a semiconductor chip and a chip support member by means of the aforementioned silicone rubber adhesive sheet. Adhesiveness of the silicone rubber adhesive sheet to the semiconductor chip and to the chip support member was evaluated, and the rejection rate of semiconductor devices was determined. The results are shown in Table 1.

Practical Example 3

The silicone rubber composition cross-linkable via a hydrosilylation reaction and produced in Practical Example 1 was sandwiched between a 50 μm thick surface-nontreated PES film and a 50 μm thick surface-nontreated TAC film. The obtained sandwich was rolled between a two-roll device with an adjustable clearance between the stainless-steel rolls so that the thickness of the silicone composition was 30 μm. A silicone-rubber adhesive sheet having a PES film adhered to one side and a TAC film adhered to the other side was produced after heating the rolled sandwich for 30 min. in an 80° C. oven with circulation of hot air.

First, the TAC film was stably peeled away from the obtained silicone rubber adhesive sheet. Measurement of forces required for peeling off both protective films showed that the surface-nontreated TAC film could be peeled off with the peeling force of 0.7 N/m, while the surface nontreated PES film could be peeled off with the peeling force of 2.3 N/m.

A semiconductor device was produced by interconnecting a semiconductor chip and a chip support member by means of the aforementioned silicone rubber adhesive sheet. Adhesiveness of the silicone rubber adhesive sheet to the semiconductor chip and to the chip support member was evaluated, and the rejection rate of semiconductor devices was determined. The results are shown in Table 1.

Practical Example 4

The silicone rubber composition cross-linkable via a hydrosilylation reaction and produced in Practical Example 1 was sandwiched between a 50 μm thick surface-nontreated PES film and a 50 μm thick PET film having a 1 μm thick TAC film adhered to the surface of the composition. The obtained sandwich was rolled between a two-roll device with an adjustable clearance between the stainless-steel rolls so that the thickness of the silicone composition was 30 μm. A silicone-rubber adhesive sheet having a PES film adhered to one side and a TAC-PET film adhered to the other side was produced after heating the rolled sandwich for 30 minutes in an 80° C. oven with circulation of hot air.

First, the TAC-PET film was stably peeled away from the obtained silicone rubber adhesive sheet. Measurement of forces required for peeling off both protective films showed that the TAC-PET film could be peeled off with the peeling force of 0.7 N/m, while the surface nontreated PES film could be peeled off with the peeling force of 2.3 N/m.

A semiconductor device was produced by interconnecting a semiconductor chip and a chip support member by means of the aforementioned silicone rubber adhesive sheet. Adhesiveness of the silicone rubber adhesive sheet to the semiconductor chip and to the chip support member was evaluated, and the rejection rate of semiconductor devices was determined. The results are shown in Table 1.

Practical Example 5

The silicone rubber composition cross-linkable via a hydrosilylation reaction and produced in Practical Example 1 was sandwiched between a 50 μm thick PET film having a 2 μm thick PES layer on the surface and a 50 μm thick PET film having a 1 μm thick TAC layer on the surface adhered to the surface of the composition. The obtained sandwich was rolled between a two-roll device with an adjustable clearance between the stainless-steel rolls so that the thickness of the silicone composition was 30 μm. A silicone-rubber adhesive sheet having a PES-PET film adhered to one side and a TAC-PET film adhered to the other side was produced after heating the rolled sandwich for 30 minutes in an 80° C. oven with circulation of hot air.

First, the TAC-PET film was stably peeled away from the obtained silicone rubber adhesive sheet. Measurement of forces required for peeling off both protective films showed that the TAC-PET film could be peeled off with the peeling force of 0.7 N/m, while the surface nontreated PES-PET film could be peeled off with the peeling force of 2.3 N/m.

A semiconductor device was produced by interconnecting a semiconductor chip and a chip support member by means of the aforementioned silicone rubber adhesive sheet. Adhesiveness of the silicone rubber adhesive sheet to the semiconductor chip and to the chip support member was evaluated, and the rejection rate of semiconductor devices was determined. The results are shown in Table 1.

Comparative Example 1

The silicone rubber composition cross-linkable via a hydrosilylation reaction and produced in Practical Example 1 was sandwiched between a 50 μm thick surface-nontreated PES film and another 50 μm thick surface-nontreated PES film. The obtained sandwich was rolled between a two-roll device with an adjustable clearance between the stainless-steel rolls so that the thickness of the silicone composition was 30 μm. A silicone-rubber adhesive sheet having a PES film adhered to both sides of the sheet was produced after heating the rolled sandwich for 30 minutes in an 80° C. oven with circulation of hot air.

When the PES film was peeled away from one side of the obtained silicone rubber adhesive sheet, the peeling surface was unstable and partial peeling of the PES film on the opposite side of the sheet was observed. Measurement of forces required for peeling off both nontreated protective films showed the peeling force of 2.3 N/m.

Comparative Example 2

The silicone rubber composition cross-linkable via a hydrosilylation reaction and produced in Practical Example 1 was sandwiched between a 50 μm thick surface-nontreated PET film and another 50 μm thick surface-nontreated PET film. The obtained sandwich was rolled between a two-roll device with an adjustable clearance between the stainless-steel rolls so that the thickness of the silicone composition was 30 μm. A silicone-rubber adhesive sheet having a PES film adhered to both sides of the sheet was produced after heating the rolled sandwich for 30 minutes in an 80° C. oven with circulation of hot air.

When the PET film was peeled away from one side of the obtained silicone rubber adhesive sheet, the peeling surface was unstable and partial peeling of the PET film on the opposite side of the sheet was observed. Measurement of forces required for peeling off both non-treated protective films showed the peeling force of 10 N/m, peeling was extremely difficult, and the films had low peelability.

TABLE 1

|  | Pr. Ex. 1 | Pr. Ex. 2 | Pr. Ex. 3 | Pr. Ex. 4 | Pr. Ex. 5 | Comp. Ex. 1 | Comp. Ex. 2 |
|---|---|---|---|---|---|---|---|
| Side A protective film | PES film | PES film | PES film | PES film | PET film with PES layer on the surface | PES film | PET film |
| Side B protective film | PES film treated with Agent No. 1 | PES film treated with Agent No. 2 | TAC film | PET film with TAC layer on the surface | PET film with TAC layer on the surface | PES film | PET film |
| First peeled side Stability of peeling surface | B | A | B Stable | B | B | A | A Unstable |
| Peeling force on side A (N/m) | 2.3 | 2.3 | 2.3 | 2.3 | 2.3 | 2.3 | 10 |
| Peeling force on side B (N/m) | 1.9 | 2.8 | 0.7 | 0.7 | 0.7 | 2.3 | 10 |
| Adhesiveness | Good | Good | Good | Good | Good | — | — |
| Rejection rate | 0/30 | 0/30 | 0/30 | 0/30 | 0/30 | — | — |

INDUSTRIAL APPLICABILITY

In peeling away protective films from both sides of the cross-linked silicone adhesive sheet of the invention, both peeling surfaces show stability. Furthermore, the aforementioned cross-linked silicone adhesive sheet can be efficiently produced by the method of the present invention for manufacturing cross-linked silicone adhesive sheets. Therefore, the cross-linked silicone adhesive sheet of the invention is used for attaching a semiconductor chip to a chip support.

What is claimed is:

1. An adhesive sheet characterized by:
   (A) a cross-linked silicone with a thickness of 100 µm or less,
   (B) a first protective film on one side of the cross-linked silicone, and
   (C) a second protective film on the opposite side of the cross-linked silicone,
   where a peeling force of component (B) away from said adhesive sheet is equal to or below 5.0 N/m,
   where a peeling force of component (C) away from said adhesive sheet is equal to or below 5.0 N/m, and
   where the difference between peeling forces of component (B) and component (C) is equal to or exceeds 0.2 N/m.

2. The adhesive sheet of claim 1, characterized in that component (A) comprises a product of cross-linking a silicone composition selected from a group consisting of a cross-linkable consisting essentially of (i) cross-linkable by a hydrosilylation reaction, (ii) cross-linkable by a condensation reaction, (iii) cross-linkable by a radical cross-linking reaction with the use of an organic peroxide, and (iv) cross-linkable with the use of ultraviolet rays.

3. The adhesive sheet of claim 1, characterized in that component (A) comprises a product of cross-linking a silicone composition cross-linkable by a hydrosilylation reaction.

4. The adhesive sheet of claim 3, characterized in that said silicone composition cross-linkable by a hydrosilylation reaction comprises:
   (A) an organopolysiloxane having at least two alkenyl groups per molecule,
   (B) an organopolysiloxane having at least two silicon-bonded hydrogen atoms per molecule,
   (C) adhesion accelerator, and
   (D) a metal hydrosilylation catalyst.

5. The adhesive sheet of claim 1, characterized in that component (B) and component (C) are made of different materials.

6. A method of manufacturing the adhesive sheet of claim 5 characterized by:
   (1) forming a film-like body by placing (A) the cross-linkable silicone composition in a layer having a thickness of 100 µm or less between (B) the first protective film and (C) the second protective film, and
   (2) cross-linking component (A).

7. A method of manufacturing an adhesive sheet characterized by:
   (1) pretreating either (B) a first protective film or (C) a second protective film with an organopolysiloxane having at least two silicon-bonded hydrogen atoms per molecule,
   (2) forming a film-like body by placing (A) a cross-linkable silicone composition in a layer having a thickness of 100 µm or less between component (B) and component (C) so as to contact component (A) with the organopolysiloxane on the surface of either component (B) or component (C), and
   (3) cross-linking component (A);
   wherein a peeling force of component (B) away from the product of step (3) is equal to or below 5.0 N/m,
   wherein a peeling force of component (C) away from the product of step (3) is equal to or below 5.0 N/m, and
   wherein the difference between peeling forces of component (B) and component (C) is equal to or exceeds 0.2 N/m.

8. An adhesive sheet prepared by the method of claim 7.

9. The adhesive sheet of claim 2, characterized in that component (A) comprises the product of cross-linking the silicone composition cross-linkable by the hydrosilylation reaction.

10. The adhesive sheet of claim 9, characterized in that said silicone composition cross-linkable by a hydrosilylation reaction comprises:
    (A) an organopolysiloxane having at least two alkenyl groups per molecule,
    (B) an organopolysiloxane having at least two silicon-bonded hydrogen atoms per molecule,
    (C) adhesion accelerator, and
    (D) a metal hydrosilylation catalyst.

11. The adhesive sheet of claim 2, characterized in that component (B) and component (C) are made of different materials.

12. A method of manufacturing the adhesive sheet of claim 11 characterized by:
    (1) forming a film-like body by placing (A) the cross-linkable silicone composition in a layer having a thickness of 100 µm or less between (B) the first protective film and (C) the second protective film, and
    (2) cross-linking component (A).

* * * * *

UNITED STATES PATENT AND TRADEMARK OFFICE
CERTIFICATE OF CORRECTION

| | | |
|---|---|---|
| PATENT NO. | : 7,198,853 B2 | Page 1 of 1 |
| APPLICATION NO. | : 10/489789 | |
| DATED | : April 3, 2007 | |
| INVENTOR(S) | : Yoshito Ushio et al. | |

It is certified that error appears in the above-identified patent and that said Letters Patent is hereby corrected as shown below:

Column 15, line 19, after "cross-linkable" delete "consisting essentially of" and insert therein --composition--.

Signed and Sealed this

Eighteenth Day of December, 2007

JON W. DUDAS
*Director of the United States Patent and Trademark Office*